United States Patent [19]

Pan

[11] Patent Number: 4,983,250
[45] Date of Patent: Jan. 8, 1991

[54] METHOD OF LASER PATTERNING AN ELECTRICAL INTERCONNECT

[75] Inventor: Ju-Don T. Pan, Austin, Tex.

[73] Assignee: Microelectronics and Computer Technology, Austin, Tex.

[21] Appl. No.: 367,083

[22] Filed: Jun. 16, 1989

[51] Int. Cl.$^5$ .................. H01L 71/306; B44C 1/22; C03C 15/00; C23F 1/02
[52] U.S. Cl. .................................. 156/628; 156/643; 156/652; 156/644; 156/656; 156/657; 156/659.1; 156/661.1; 156/662; 156/668; 219/121.85; 357/71; 437/192; 437/194; 437/198; 437/199; 437/246
[58] Field of Search .............. 156/628, 643, 644, 652, 156/653, 656, 657, 659.1, 661.1, 662, 668; 437/189, 190, 192, 194, 196, 198, 199, 202, 246; 357/71; 219/121.66, 121.69, 121.85

[56] References Cited

U.S. PATENT DOCUMENTS

| | | | |
|---|---|---|---|
| 4,450,041 | 5/1984 | Aklufi | 156/628 |
| 4,566,937 | 1/1986 | Pitts | 156/628 |
| 4,569,124 | 2/1986 | Rench et al. | 156/628 X |

Primary Examiner—William A. Powell
Attorney, Agent, or Firm—Fulbright & Jaworski

[57] ABSTRACT

Forming an electrical interconnect by applying an adhesion layer over a substrate, applying an electrical conductor layer over the adhesion layer, and applying a reacting layer over the electrical conductor layer. A laser beam is directed over the reacting layer in a desired pattern to interdiffuse the reacting and conductor layers and form a reaction product. The reaction product is used as an etch mask for etching away the reacting layer, the conductor layer, and the adhesion layer outside of the reaction product.

19 Claims, 2 Drawing Sheets

METHOD OF LASER PATTERNING AN ELECTRICAL INTERCONNECT

BACKGROUND OF THE INVENTION

Incorporation of integrated circuits into microelectronics requires a method for interconnecting the various devices with each other or with other systems. This has created a need for high density interconnects and multilayer interconnects. Presently, various methods are available such as, for example, the metal/polymer interconnect substrates in which multilayer wiring connects are made by sequentially patterning metals on a substrate, depositing and curing polymeric dielectrics on top, and removing part of the polymer for making interlayer connections.

The present invention is directed to providing a method of making an electrical interconnect in which layers can be deposited, laser patterned, and wet etched to form the pattern for various types of interconnect applications including multilayer interconnects.

SUMMARY

The present invention is directed to a method of forming an electrical interconnect including applying an adhesion layer over a substrate, applying an electrical conductor layer over the adhesion layer, and applying a reacting layer over the electrical conductor layer. Thereafter, a laser beam is directed over the reacting layer in a desired pattern inducing the reacting and the top surface region of the conductor layers to interdiffuse and form a reaction product of the reacting and conductor layers. The reaction product includes the alloy, intermetallic, or compound formed by the interdiffused layers as a result of the irradiation. Thereafter, the reacting layer, the conductor layer, and the adhesion layer outside of the regions protected by the formed reaction product are etched away leaving the reaction product in the desired pattern on the substrate.

Another object of the present invention is wherein a dielectric layer is applied to the substrate prior to applying the adhesion layer for forming the electrical interconnect on the dielectric layer.

Still a further object of the present invention is wherein the laser beam is applied in very short durations to induce interdiffusion between the reacting and the conductor layers without harming the other layers with heat.

Yet a still further object of the present invention is wherein the etching of the reacting, conductor and adhesion layers is performed separately and sequentially.

Yet a still further object of the present invention is wherein the etching of the non-reacting portion of the reacting layer, conductor and adhesion layers is performed.

Yet a further object of the present invention includes fabricating a multilayer interconnect by applying a dielectric layer over the substrate, with the first layer of electrical interconnect formed in the desired patterns, patterning the dielectric layer with a via pattern, and thereafter applying a second adhesion layer to the dielectric layer, applying a second electrical conductor layer over the second adhesion layer, and applying a second reacting layer over the second electrical conductor layer. Thereafter, a laser beam is directed over the second reacting layer in a desired pattern inducing the second reacting and the top surface region of the second conductor layers to interdiffuse and form a second reaction product. Thereafter, the second reaction product is used as a mask for etching away the second reacting layer, the second conductor layer, and the second adhesion layer outside of the regions protected by the second reaction product. Or, if desired, the nonreacting portion of the second reacting layer can be used as a mask. More layers of electrical interconnect can be fabricated by repeating this sequence of processing steps.

Yet a still further object of the present invention is the method of making an electrical interconnect which includes applying a dielectric layer over a substrate, applying an adhesion layer selected from a group consisting of chromium, titanium, nickel, tantalum, titanium-tungsten, nichrome, or other suitable materials over the dielectric, applying an electrical conductor layer selected from a group consisting of copper, gold, aluminum, silver, nickel, or other suitable materials over the adhesion layer, and applying a reacting layer selected from a group consisting of chromium, titanium, nickel, silicon, or other suitable materials over the electrical conductor layer. Thereafter, a laser beam is directed over the reacting layer in a desired pattern inducing the reaCting layer and the top surface regions of the conductor layers to interdiffuse into a reaction product. The reacting layer, the conductor layer, and the adhesion layer outside of the regionS protected by the reaction product are etched away separately and sequentially, leaving the reaction product/conductor/adhesion composite in the desired pattern on the dielectric.

Yet a still further object of the present invention is wherein the conductor layer is made of a material, such as aluminum, which provides adhesion to the substrate, thereby not requiring a separate adhesive layer between the conductor and the substrate.

Other and further objects, features, and advantages will be apparent from the following description of a presently preferred embodiment of the invention, given for the purpose of disclosure, and taken in conjunction with the accompanying drawings.

DESCRIPTION OF THE PREFERRED EMBODIMENT

Figure 1:
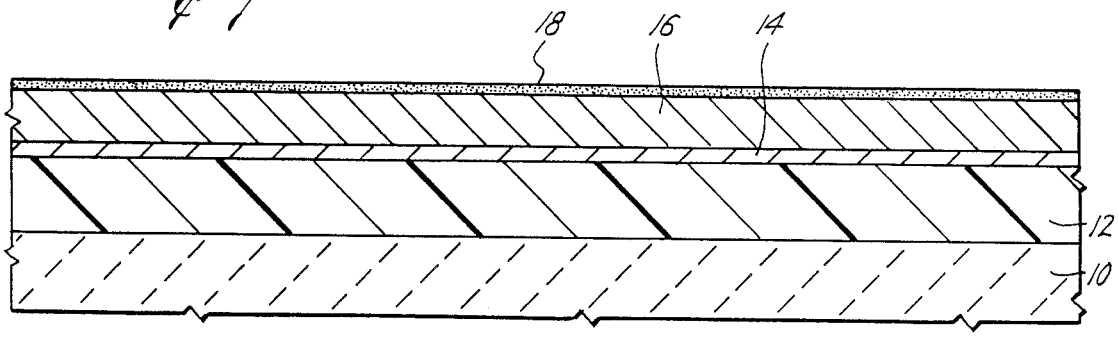
FIGS. 1-3 are fragmentary elevational views, in cross section and in sequence, illustrating the general theory and method of the present invention of depositing layers, laser patterning the interconnect to form an reaction product mask, and etching to form a patterned interconnect.

Referring now to FIG. 1, the reference numeral 10 generally indicates any suitable substrate. The substrate may be a silicon wafer, a gallium arsenide wafer, both with or without active devices on the surface, or ceramics such as alumina ceramic, aluminum nitride, silicon carbide, or glass ceramic. Preferably, a dielectric 12 is applied over the surface of the substrate 10 such as polyimide, silicon oxide, or silicon nitride, although in some cases the dielectric layer 12 may be omitted in the event the substrate 10 is an insulating material with a good surface finish.

Thereafter, an adhesion layer 14 is applied over the dielectric 12. For example, an adhesion layer 14 of 700 angstroms of chromium may be sputter deposited on the dielectric layer 12 or directly upon the substrate 10. Of course, other adhesion materials may be used such as titanium, nickel, tantalum, titanium-tungsten, or nichrome. Thereafter, an electrical conductor layer 16 is applied over the adhesion layer 14. For example, the conductor layer 16 may be a 4 microns thick layer of copper which is conventionally applied such as by sputering, evaporation, or electrical plating. Of course, other electrical conductors may be used such as gold, aluminum, silver or nickel.

If desired, the adhesive layer 14 may be omitted and an adhesive conductor layer 16 can be applied directly to the dielectric layer 12 or, if there is no dielectric layer 12, to the substrate 10. A preferred adhesive conductor layer 16 that will directly adhere to the substrate 10 is aluminum.

Thereafter, a reacting layer 18 is applied over the electrical conductor layer 16. For example, the layer 18 may be a sputter deposited titanium layer of 500 angstroms thick. Other suitable reacting materials include chromium, nickel, and silicon.

Figure 2:
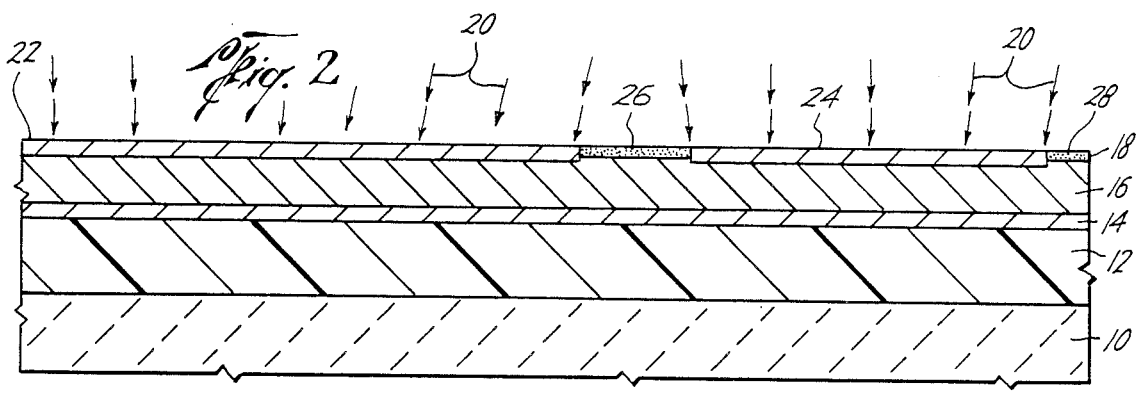

Referring now to FIG. 2, a laser beam is directed across the reacting layer 18 in a desired pattern to produce the desired electrical connections. For example, a short pulse laser, such as an excimer laser, is provided with a beam 20 with the proper power, focus, scan rate and pulse repetition rate is directed across portions 22 and 24 of the reacting layer 18. The laser beam 20 will induce local interdiffusion between the reacting layer 18 and at least the top surface region of the conductor layer 16 to provide a reaction product 22 and 24 here shown as forming an X interconnect line 22 and a Y interconnect line 24. In the example given wherein the conductor 16 is copper and the reacting layer 18 is titanium, the reaction product will be an alloy of titanium and copper and for example may be 0.2 microns thick. Preferably, the laser has a short pulse rate, for example 20 nsec, which while providing sufficient energy to create the reaction products 22 and 24, will not have lateral spreading of thermal energy and will not cause heating and damage to the underlying layers, particularly the dielectric layer 12, which if polyimide cannot be subjected to temperatures higher than 450 degrees celsius without degradation.

It is noted from FIG. 2 that the laser beam 20 was not applied to portions 26 and 28 of the reacting layer 18 as these were not regions in which electrical interconnect lines were desired.

If desired, the interdiffusion between the reacting layer 18 and the conductor layer 16 extends through the entire thickness of the conductor 16 so that the reaction products 22 and 24 contact the layer of material beneath the conductor layer 16. In this case the reaction products 22 and 24 will form the entire conductive interconnect.

Figure 3:
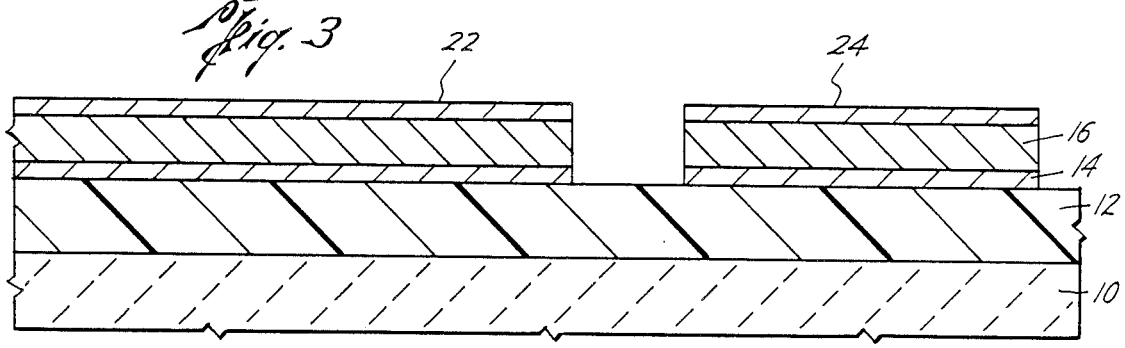

Referring now to FIG. 3, the reaction product sections 22 and 24 may be used as etch masks for etching away the undesired portion of the layers 18, 16 and 14 which are not used for electrical conductors. The undesired layers are etched away, separately and sequentially, while little or none of the reaction product sections 22 and 24 are etched, to leave the desired electrical patterns 22 and 24. For example, layer 18 of titanium may be stripped in a mild solution such as 0.5% hydrofluoric acid solution. Similarly, the copper conductor layer 16 may be etched away by the use of any suitable etchant, such as ammonium persulfate/phosphoric acid solution. And the chromium layer 14 may be etched away by a conventional etchant such as alkaline ferric cyanide. If desired, a different combination of materials and/or etchants can be used so that the reaction product sections 22 and 24 are etched away while little or none of the non-reacted regions 26 are etched.

FIGS. 1-3 therefore describe the basic concept of the present invention in which a plurality of layers are deposited upon a substrate, are laser patterned for direct write patterning to form a reaction product, such as an alloy, intermetallic, or compound which can be used as an etch mask for wet etching away the layers in the regions which are not exposed to laser irradiation, thereby providing a patterned electrical interconnect. In addition, as best described in FIGS. 4-7, the present invention can be used to fabricate multilayer interconnects. Multilayer interconnects consist of multiple layers of alternating dielectric layers and conductor layers.

In the multilayer embodiment described in FIGS. 4-7, each conductor layer will be patterned using the present laser direct write to form interconnect lines and each dielectric layer will be patterned to form vias to allow electrical contacts between various layers of electrical interconnect. While, of course, the alternating dielectric layer can be made in various ways, it is preferred in the present invention that the dielectric be a positive-working photodefinable polyimide, which can be patterned with laser direct exposure and followed by developing to form the pattern. One example of this dielectric material is the positive-working polyimide resist produced by Brewer Science, Inc. Another way to make the dielectric layer is to use any polyimide and to use laser ablation to form via patterns in the polyimide films. With either of these methods of patterning the dielectric layer, it is possible to fabricate the whole multilayer interconnect without any photoresist and photolithography process. Alternatively, the via patterns in the dielectric layers can be formed with conventional photolithographic and etch processes.

Figure 4:
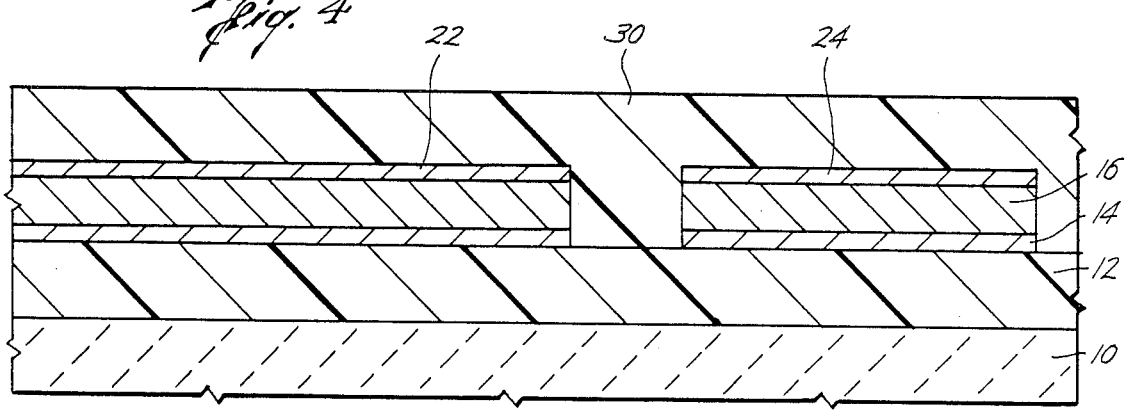
FIGS. 4-7 are fragmentary elevational views, in cross section and in sequence, illustrating the method of making multilayer interconnects starting with the structure of FIG. 3.

Thus, referring to FIG. 4, a dielectric coating such as polyimide 30 using a photodefinable polyimide process reduces the number of conventional processing steps and the polyimide 30 may be conventionally applied such as by spin-coating, spraying, or roller-coating.

Figure 5:
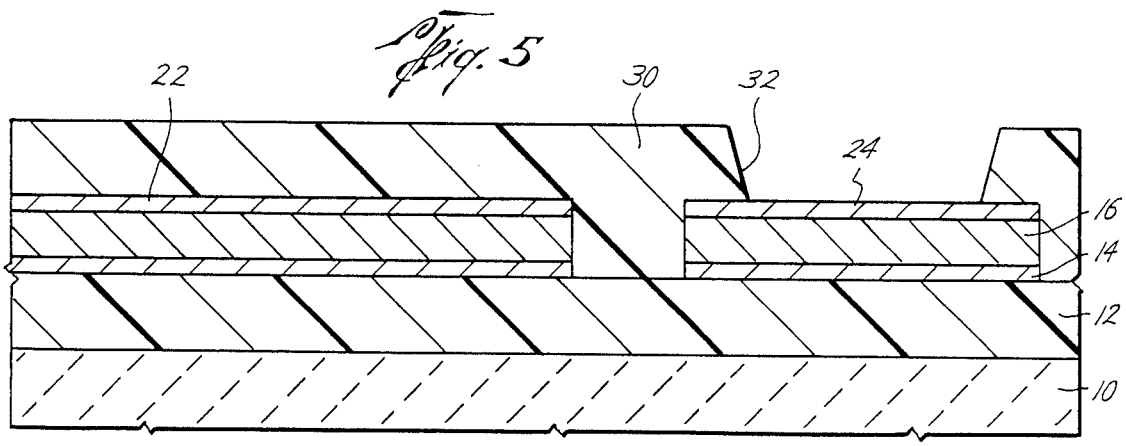

Referring now to FIG. 5, via 32 may be made in the polyimide 30 as is conventional by laser patterning and developing. As here shown, the via 32 is positioned over the Y conductor 24.

Figure 6:
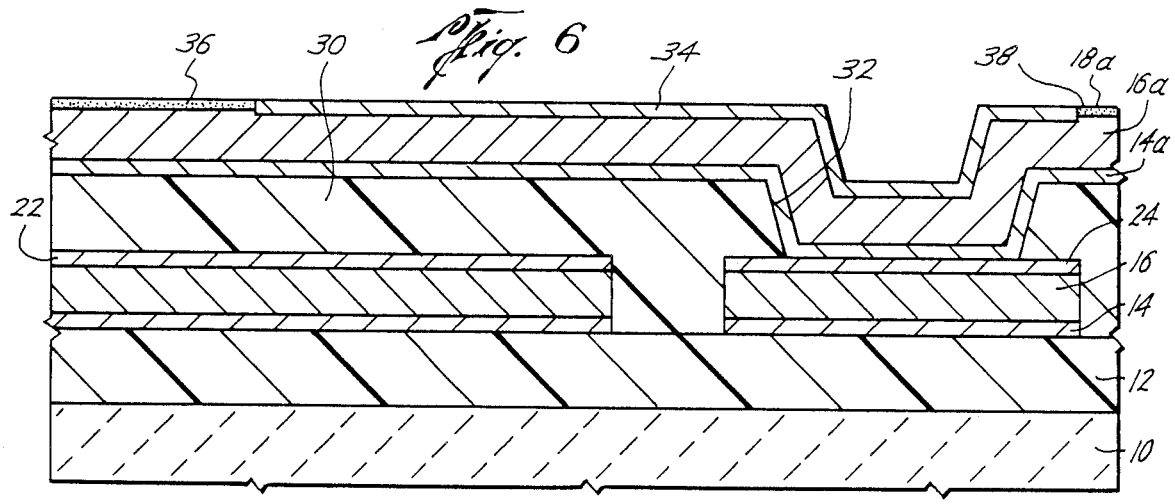

Referring now to FIG. 6, the next step is to sequentially apply layers of an adhesion layer 14a, such as chromium, a conductor layer 16a, such as copper, and a reacting layer 18a, such as titanium. That is, layers 14a, 16a, and 18a are applied similarly to the first layers 14, 16 and 18. And as best seen in FIG. 6, a laser beam is directed over a portion of the reacting layer 18a in a desired pattern to form a reaction product 34, but leaving portions 36 and 38 of layer 18a unreacted.

Figure 7:
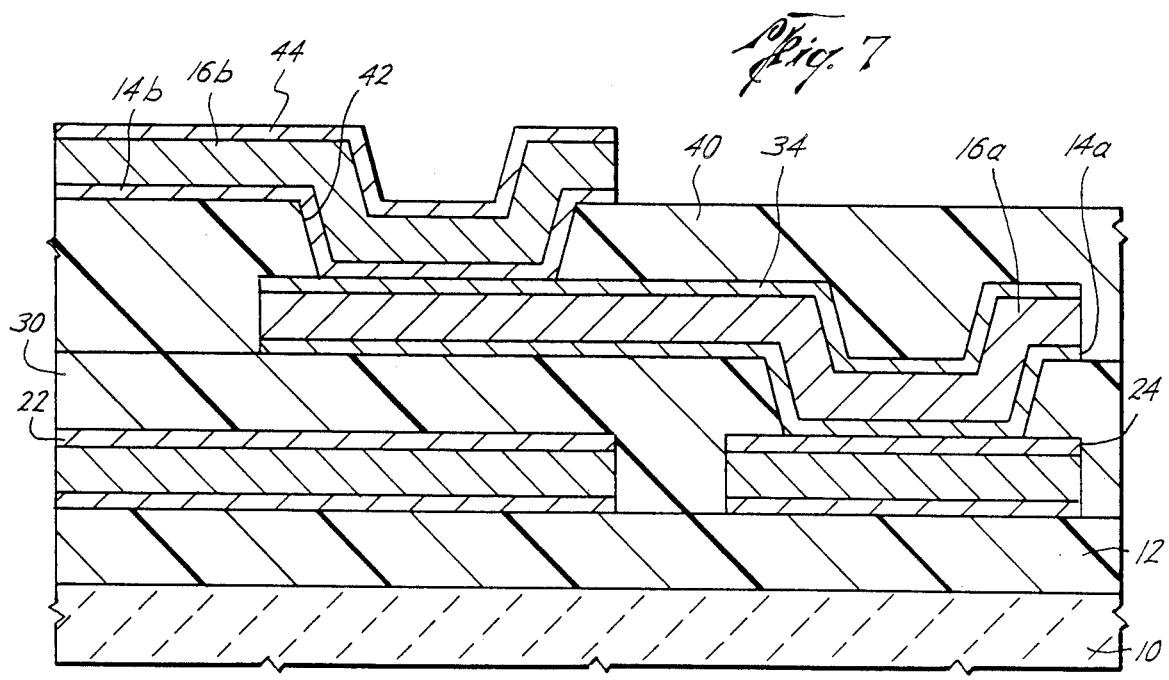

Thereafter, the untreated portions 36 and 38 of reacting layer 18a and the portions of the layers 16a and 14a under the portions 36 and 38 are etched away, separately and sequentially, as described in connection with FIG. 3. This leaves the electrical interconnect, and the underlying adhesion layer if it exists, masked by reaction product 34 in place and connected to Y interconnect line 24. Thereafter, as best seen in FIG. 7, a second layer of polyimide 40 is applied, another via 42 is created as before, and additional layers are provided as before. That is, adhesion layer 14b, conductor layer 16b, and a reacting layer, not shown, is provided as before. The reacting layer (not shown) is then irradiated by a laser as before to provide a reaction product 44 in the desired pattern thereby defining an etch mask and the reacting layer (not shown), the conductor layer 16b, and the adhesion layer 14b, outside of the reaction product 44 are etched away as before.

Additional layers may be formed, if desired, of alternating dielectric layers and conductor layers in any desired pattern.

The present invention, therefore, is well adapted to carry out the objects and attain the ends and advantages mentioned, as well as others inherent therein. While a presently preferred embodiment of the invention has been described for the purpose of disclosure, numerous changes in the steps of the process will be readily apparent to those skilled in the art and which are encompassed within the spirit of the invention and the scope of the appended claims.

What is claimed is:

1. A method of forming an electrical interconnect comprising,
   applying an adhesion layer over a substrate,
   applying an electrical conductor layer over the adhesion layer,
   applying a reacting layer over the electrical conductor layer,
   directing a laser beam over the reacting layer in a desired pattern inducing the reacting layer and the conductor layer to interdiffuse and form a reaction product of the reacting and conductor layers, and
   applying an etchant after the interdiffusion such that the reacting layer etches at a different rate than the reaction product, so that the desired conductor pattern can be formed.

2. The method of claim 1 including,
   applying a dielectric layer to the substrate prior to applying the adhesion layer.

3. The method of claim 1 Wherein the laser beam is applied in pulses to induce local interdiffusion between the reacting and the conductor layers without harming the other layers with heat.

4. The method of claim 1 wherein the etching of the reacting, conductor, and adhesion layers is performed separately and sequentially.

5. The method of claim 1 wherein the reacting layer and the top surface region of the conductor layer are interdiffused.

6. The method of claim 1 including,
   applying a dielectric layer over the substrate and resultant reaction product, and
   applying a second adhesion layer over the dielectric layer,
   applying a second electrical conductor layer over the second adhesion layer,
   applying a second reacting layer over the second electrical conductor layer,
   directing a laser beam over the second reacting layer in a desired pattern inducing the second reacting and second conductor layers to interdiffuse and form a second reaction product of the second reacting and second conductor layers, and
   applying an etchant after the interdiffusion of the second reacting and second conductor layers such that the second reacting layer etches at a different rate than the second reaction product, so that the desired second conductor pattern can be formed.

7. The method in claim 6 including,
   patterning the dielectric layer with vias.

8. A method of forming an electrical interconnect comprising,
   applying an adhesive electrical conductor layer over the substrate,
   applying a reacting layer over the electrical conductor layer,
   directing a laser beam over the reacting layer in a desired pattern inducing the reacting layer and the conductor layer to interdiffuse and form a reaction product of the reacting and conductor layers, and
   applying an etchant after the interdiffusion such that the reacting layer etches at a different rate than the reaction product, so that the desired conductor pattern can be formed.

9. The method of claim 8 including,
   applying a dielectric layer to the substrate prior to applying the adhesive electrical conductor layer.

10. The method of claim 8 wherein the laser beam is applied in pulses to induce local interdiffusion between the reacting and the adhesive electrical conductor layers without harming the other layers with heat.

11. The method of claim 8 wherein the etching of the reacting and adhesive electrical conductor layers is performed separately and sequentially.

12. The method of claim 8 wherein the reacting layer and the top surface region of the adhesive electrical conductor layer are interdiffused.

13. The method of claim 8 including,
    applying a dielectric layer over the substrate and resultant reaction product, and
    applying a second electrical conductor layer over the dielectric layer,
    applying a second reacting layer over the second electrical conductor layer,
    directing a laser beam over the second reacting layer in a desired pattern inducing the second reacting and second conductor layers to interdiffuse and form a second reaction product of the second reacting and second conductor layers, and
    applying an etchant after the interdiffusion of the second reacting and second conductor layers such that the second reacting layer etches at a different rate than the second reaction product so that the desired second conductor pattern can be formed.

14. The method of claim 13 including,
    patterning the dielectric layer with vias.

15. The method of claim 13 including,
    applying a second adhesive layer between the dielectric layer and the second electrical conductor layer.

16. The method of claim 15 including,
    patterning the dielectric layer with vias.

17. The method of claim 8 wherein the reacting layer is selected from a group consisting of chromium, titanium, nickel, and silicon.

18. The method of claim 17 wherein the adhesive electrical layer consists of aluminum.

19. A method of forming an electrical interconnect comprising,
    applying a dielectric layer over a substrate,
    applying an adhesion layer selected from a group consisting of chromium, titanium, nickel, tantalum, titanium-tungsten, and nichrome over the dielectric, applying an electrical conductor layer selected from a group consisting of copper, gold, aluminum, silver and nickel over the adhesion layer, applying a reacting layer Selected from a group consisting of chromium, titanium, nickel, and silicon over the electrical layer, directing a laser beam over the reacting and conductor layers to interdiffuse and form a reaction product of the reacting and conductor layers, and etching away the reacting layer, the conductor layer and the adhesion layer outside of the regions masked by reaction product, separately and sequentially, leaving reaction product in the desired pattern on the dielectric.

* * * * *